United States Patent [19]

Du

[11] Patent Number: 5,440,440
[45] Date of Patent: Aug. 8, 1995

[54] HIGH CURRENT SOLID STATE AC RELAY WITH LOW EMI EMISSION

[75] Inventor: Tian T. Du, Buena Park, Calif.

[73] Assignee: Teledyne Industries, Inc., Los Angeles, Calif.

[21] Appl. No.: 191,801

[22] Filed: Feb. 3, 1994

[51] Int. Cl.$^6$ .............................................. H02H 3/20
[52] U.S. Cl. ........................................ 361/18; 361/56; 361/91
[58] Field of Search ...................... 361/18, 56, 91, 86, 361/111; 323/276

[56] References Cited

U.S. PATENT DOCUMENTS 3,571,660  3/1971  Phillips ................................ 361/111
5,146,386  9/1992  Learned ................................ 361/91

*Primary Examiner*—Todd Deboer
*Attorney, Agent, or Firm*—Blakely Sokoloff Taylor & Zafman

[57] ABSTRACT

A solid state relay comprising a pair of SCRs connected in inverse parallel relationship across a pair of output terminals adapted to be connected in series with a source of AC power and a load, each SCR having an anode connected to one of the pair of output terminals, a cathode connected to another of the pair of output terminals, and a gate terminal; a pair of MOSFETs connected as a bidirectional switch for providing a single current path connecting the gate terminals of each of the pair of SCRs, the bidirectional switch allowing current application to the gate terminals without generating switching noise; a pair of diodes allowing current to transfer in one direction from each of the output terminals to each of the gate terminals of the SCRs; a source of optically coupled input signals which are applied to rapidly enable the bidirectional switch to provide a current path to the gate terminals of the SCRs and to maintain the bidirectional switch in the on condition as long as an input signal is furnished by the source of input signals; and a bridge circuit for monitoring the voltage across the output terminals and allowing the signals from the source of input signals to rapidly enable the bidirectional switch only during a period in which the voltage across the output terminals is less than a preselected zero voltage window value.

17 Claims, 3 Drawing Sheets

HIGH CURRENT SOLID STATE AC RELAY WITH LOW EMI EMISSION

BACKGROUND OF THE INVENTION

1. Field of the Invention

This invention relates to solid state relays and, more particularly, to methods and apparatus for reducing the level of electro-magnetic interference emissions (EMI) causes by commutation voltage spikes.

2. History of the Prior Art

One type of prior art solid state AC relay uses silicon controlled rectifiers (SCRs) as switching elements to provide current to an output load device from a source of alternating current. An SCR is a type of semiconductor device that is triggered into conduction by injecting a control current into its gate terminal. Once triggered, the SCR will remain in the on condition and conduct current with low voltage drop until there is no longer a sufficient anode current available or until the anode current drops below the minimum latch current of the SCR. This characteristic of an SCR by which it turns off at near zero current makes it a valuable switching element for solid state AC relays because switching at low current generates much less electro magnetic interference (EMI) than is generated by a typical switch.

By utilizing a pair of such SCR devices in inverse parallel arrangement connected across the load and the source of current, the current to the load may be controlled. It has become typical to utilize an input circuit for the output SCR switching elements which is itself a relay constructed of a pair of light sensitive SCR switching elements and features both the zero current turn-off characteristic mentioned above and a zero voltage turn-on characteristic. A zero voltage turn-on circuit is so called because the relay tends to switch on in a range at which the voltage being controlled has a minimal value. For example, one such circuit might switch in a range of plus or minus ten volts for an AC source voltage varies from plus 250 volts to minus 250 volts RMS. Both zero voltage turn-on and zero current turn-off features have been found desirable because they tend to eliminate a great deal of the transient problems which occur if the relay is switched on at an instant when the AC voltage or current being controlled has a substantial value.

The input circuit used by the prior art is optically-coupled to a source of control signals which may be provided by digital control circuitry. Such optical coupling provides excellent electrical isolation between the logic signals and the AC loads which they control. An input signal applied through the optically-coupled relay input portion will turn on one of the output SCRs allowing it to conduct and furnish current to the load until the current to the anode of the output SCR fails below an amount sufficient to maintain conductance. At this point, the AC source current changes polarity and switches on the other of the output SCRs which responds in the same manner to apply current to the load in the opposite sense.

However, it has been discovered that in cases involving high load currents, these prior art zero voltage turn-on and zero current turn-off circuits will generate an amount of EMI noise which is unacceptable for many applications.

SUMMARY OF THE INVENTION

It is, therefore, an object of the present invention to provide an improved solid state relay providing both zero voltage turn-on and zero current turn-off in which EMI noise is reduced to a negligible amount.

It is another more specific object of the present invention to provide an improved solid state relay providing both zero voltage turn-on and zero current turn-off in which switching is accomplished more rapidly that in prior art circuits.

Another object of the present invention is to provide a circuit in accordance with the foregoing objects which is able to operate at an input power which is compatible with direct computer interfacing.

Yet another object of the present invention is to provide indirect means for eliminating response to rapid voltage changes in order to prevent false triggering.

These and other objects of the present invention are realized in a solid state relay comprising a pair of SCRs connected in inverse parallel relationship across a pair of output terminals adapted to be connected in series with a source of AC power and a load, each SCR having an anode connected to one of the pair of output terminals, a cathode connected to another of the pair of output terminals, and a gate terminal; a pair of MOSFETs connected as a bidirectional switch for providing a single current path connecting the gate terminals of each of the pair of SCRs; a pair of diodes allowing current to transfer in one direction from each of the output terminals to each of the gate terminals of the SCRs; a source of optically coupled input signals; means for applying the input signals to rapidly enable the bidirectional switch to provide a current path to the gate terminals of the SCRs and to maintain the bidirectional switch in the on condition as long as an input signal is furnished by the source of input signals; and a bridge circuit for monitoring the voltage across the output terminals and allowing the operation of the means for applying signals from the source of input signals to rapidly enable the bidirectional switch only during a period in which the voltage across the output terminals is less than a preselected zero voltage window value.

These and other objects and features of the invention will be better understood by reference to the detailed description which follows taken together with the drawings in which like elements are referred to by like designations throughout the several views.

DETAILED DESCRIPTION OF THE INVENTION

Figure 1:
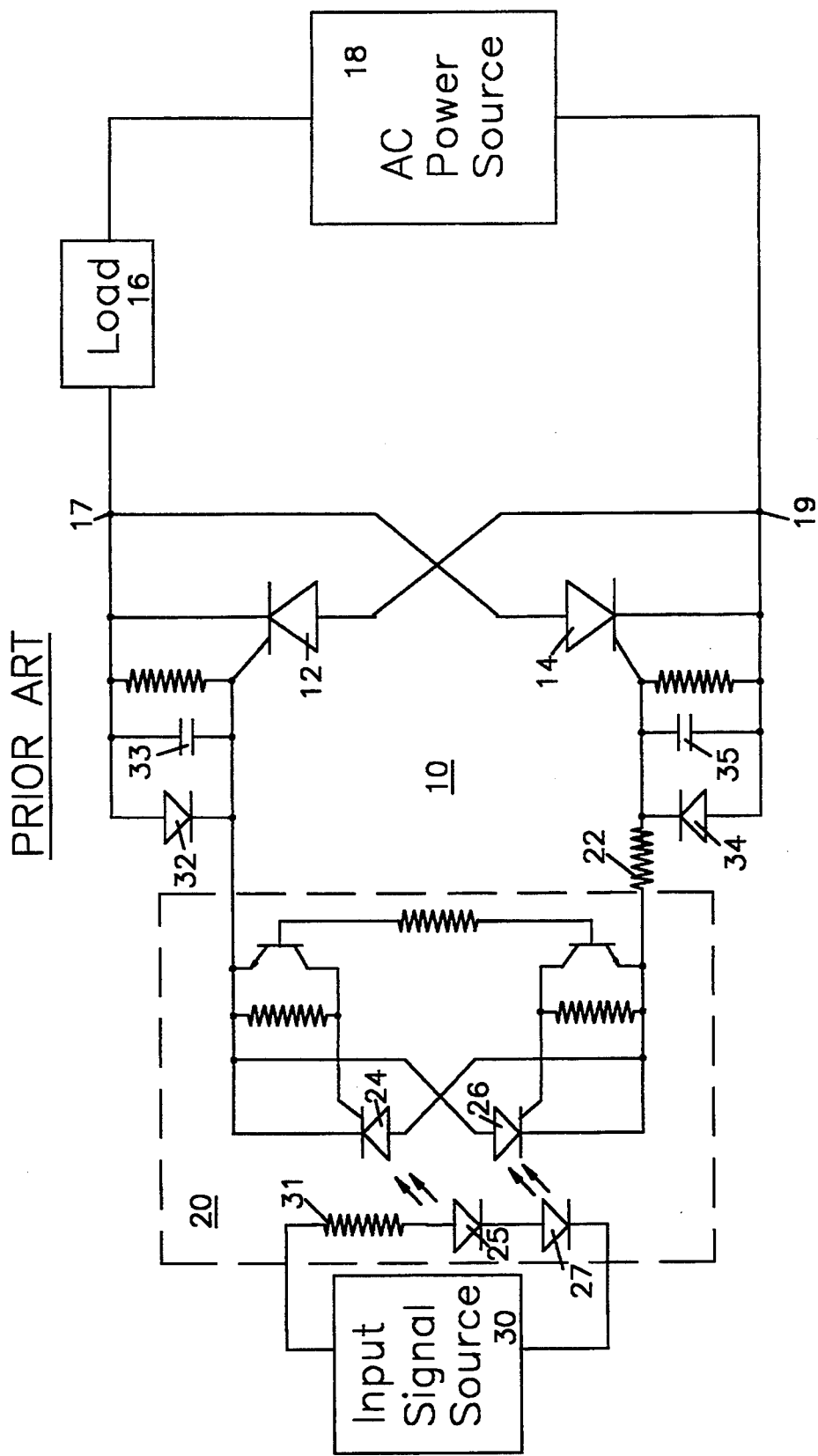
FIG. 1 is a circuit diagram illustrating a solid state relay constructed in accordance with the teaching of the prior art.

Referring now to FIG. 1, there is illustrated a schematic diagram of a circuit 10 constructed in accordance with the teachings of the prior art. The circuit 10 includes a pair of inverse-parallel-connected silicon controlled rectifiers (SCRs) 12 and 14 which control the current through a load 16 from an AC power source 18. The SCRs 12 and 14 are connected to receive input signals from a circuit 20. The circuit 20 is itself an optically-coupled SCR-based relay which features both zero voltage turn-on and zero current turn-off. The output terminals of the circuit 20 are connected to the gate terminals of the output SCRs 12 and 14 through a path which includes a current limiting resistor 22. The circuit 20 includes a pair of light sensitive SCRs 24 and 26. The SCRs 24 and 26 are activated into conduction at near zero volts when they receive photo energy from a pair of light emitting diodes 25 and 27. The conduction of the input SCRs 24 and 26 provides a current path to the gate terminals of the output SCRs 12 and 14 for triggering the SCRs 12 and 14. When the photo-sensitive SCRs 24 and 26 are enabled by input energy, if the voltage furnished by the AC power source 18 is positive at a node 17 and negative at a node 19, then current flows from the source 18 through a diode 32, the photo-sensitive SCR 26, and the resistor 22, into the gate terminal of the output SCR 14. This triggers the SCR 14 into conduction providing current to the load 16. When the polarity of the AC load voltage changes, current through the gate terminal of the SCR 14 ceases; and the SCR 14 becomes reverse biased and stops conducting. Thus, the SCR 14 so connected provides a zero current turn-off feature. However, as the SCR 14 turns off, a new current path is provided through a diode 34, the resistor 22, and the photo-sensitive SCR 24 to the gate terminal of the output SCR 12. The current through this path triggers the SCR 12 into conduction and allows current to be furnished in the opposite direction to the load 16 from the source 18. A pair of capacitors 33 and 35 are used to provide a low dynamic impedance for the gate terminals of the SCRs 12 and 14 to prevent false triggering should a rapid voltage transient (dv/dt) in the voltage from the source 18 occur.

This typical prior art circuit exhibits both zero voltage turn on and zero current turn off. However, in situations involving high load currents, this design will generate substantial amounts of EMI noise. Such noise is unacceptable in some applications, particularly in aerospace use.

Figure 2:
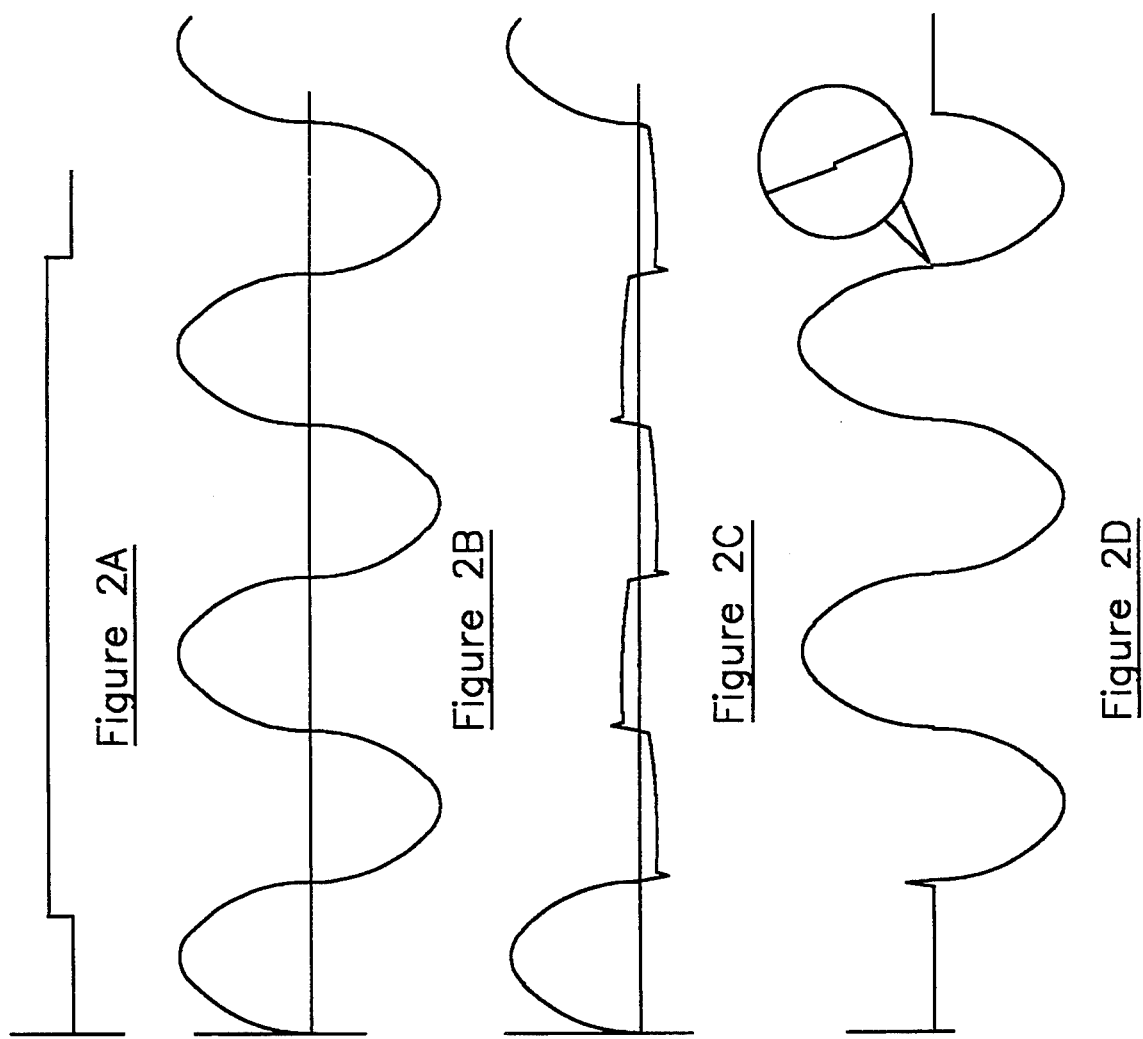
FIG. 2 is a series of diagrams illustrating the wave forms produced with the circuit of FIG. 1.

The diagrams of FIG. 2 help to illustrate how this noise is generated. FIG. 2A illustrates the wave form of the input control voltage provided by an input signal source 30 through a resistor 31 to the light emitting diodes 25 and 27. FIG. 2B illustrates the wave form of the AC line voltage provided by the AC power source 18. FIG. 2C illustrates the wave form of the voltage across the output SCRs 12 and 14, while FIG. 2D illustrates the wave form of the current through the output SCRs 12 and 14. As may be seen in FIG. 2D, the current does not produce a perfect sine wave through SCRs 12 and 14 and thus through the load 16. As the enlarged portion of the figure illustrates, the load current ceases flowing in one direction through one of the output SCRs and does not come back on through the other SCR for some finite time at the point at which the SCRs 12 and 14 switch states. This is due to the fact that the SCRs 12 and 14 must be retriggered into conduction on each half cycle of the AC voltage from the source 18. There is a finite time delay from the moment the source voltage changes polarity until the time the forward biased SCR 12 or 14 can be retriggered into conduction.

Several factors contribute to this time delay and thus contribute to the discontinuity in the output current wave form. The primary contributors are the photo-sensitive SCRs 24 and 26 which do not begin to conduct instantaneously when the line voltage changes polarity. Moreover, these SCRs 24 and 26 contribute a significant diode voltage drop which the line voltage must overcome before there is sufficient trigger current at the gate terminals of the SCRs 12 and 14 to cause conduction. This drop tends to increase the time required to switch the SCRs 12 and 14. An additional delay is caused by the time required to charge the capacitors 33 and 35 to the gate-to-cathode threshold voltage of the output SCRs 12 and 14. These voltage drops cause the voltage spikes which may be seen in FIG. 2C at the leading edge of each change of polarity; these voltage spikes contribute to the EMI noise.

The present invention overcomes these shortcomings of the prior art by providing a solid state relay circuit which incorporates a pre-driver circuit with instantaneous turn-on and low impedance in the on state. The pre-driver circuit, once on, does not switch on polarity change of the AC power source and thus does not slow the switching of the output SCRs. The pre-driver circuit also eliminates the time delays in switching the output SCRs caused by the charging time of the capacitors of the circuit 10.

Figure 3:
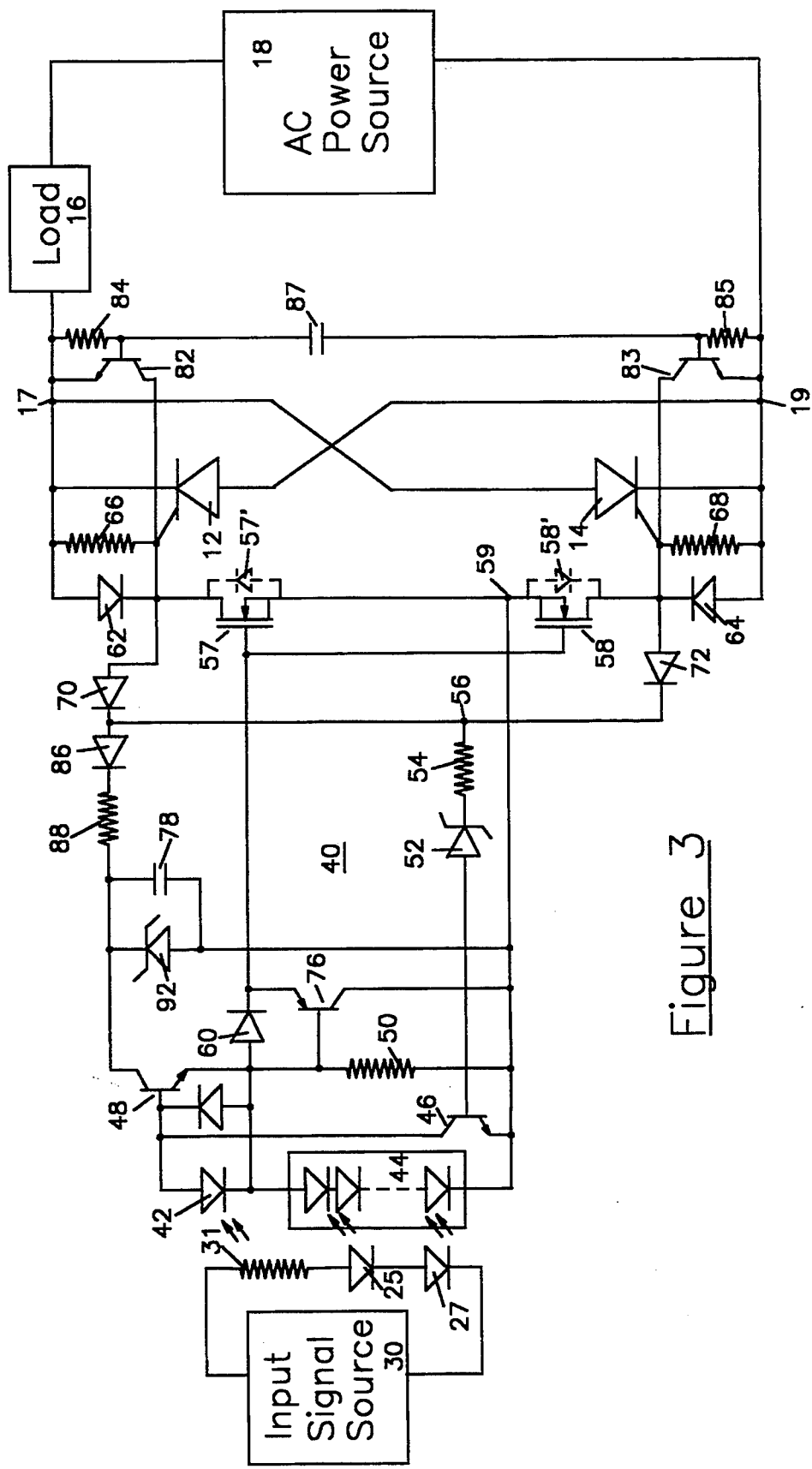
FIG. 3 is a circuit diagram illustrating a solid state relay constructed in accordance with the teaching of the present invention.

FIG. 3 illustrates such a circuit 40. The circuit 40 utilizes a pair of output SCRs 12 and 14 connected in inverse parallel relationship across a load circuit 16 and an AC power source 18. As with the circuit of FIG. 1, the SCRs 12 and 14 provide full wave control of the output across the load circuit 16. Input control signals to the SCRs 12 and 14 are provided from an input signal source 30 which may be a source of digital signals. The source 30 is connected in an optically-coupled, and thus electrically isolated, circuit which includes a resistor 31 and a pair of light emitting diodes 25 and 27. Signals from the source 30 cause light to be generated by the light emitting diodes 25 and 27 which light is furnished to photo-voltaic detectors such as photo-voltaic (or light sensing) diodes 42 and 44. This optical coupling arrangement allows the circuit 40 to be controlled by the output of a computer or other digital controller. The wave form of FIG. 2A may be considered to represent an input signal provided by the source 30.

A first NPN transistor 46 has its emitter and collector terminals connected across the photo diode 42 and photo detector array 44. The base terminal of the transistor 46 is connected through a zener diode 52 and a resistor 54 to a node 56. A second NPN transistor 48 has its base terminal connected to the collector terminal of the transistor 46 and the anode of the photo diode 42, and its emitter terminal connected through a resistor 50 to the emitter terminal of the transistor 46.

Rather than the input SCRs used by the prior art circuit of FIG. 1 to control the current to the gate terminals of the output SCRs 12 and 14, the circuit 40 utilizes a pair of metal oxide silicon field effect transistors (MOSFETs) 57 and 58 which have their source terminals joined together. The gate terminals of the MOSFETs 57 and 58 are joined by a diode 60 to the anode of the photo sensitive array 44, while the source terminals of the MOSFETS 57 and 58 are joined to the cathode of the array 44. The drain terminals of the MOSFETs 57 and 58 are connected, respectively, to the gate terminals of the SCRs 12 and 14. A pair of resistors 66 and 68 are provided for shunting the gate and cathode terminals of each SCR 12 and 14 to avoid an open gate configuration. A pair diodes 62 and 64 furnish low impedance current paths for triggering the SCRs 12 and 14 while minimizing any commutating voltage spikes.

As may be seen, the MOSFETs 57 and 58 are configured as a bidirectional switch. The state of the output SCRs 12 and 14 is determined by the state of this bidirectional switch. Assuming that the voltage provided by the AC power source 18 is just becoming positive at a node 17 and negative at a node 19, then the SCR 12 becomes reverse biased and will not conduct. Simultaneously, the SCR 14 becomes forward biased and capable of being triggered into conduction if and only if the MOSFETs 57 and 58 are conducting.

If the MOSFETs 57 and 58 are not conducting, there is no current path to trigger the SCR 14 into conduction. So long as there is no input signal from the source 30, the only current path which exists for current furnished by the source 18 from the node 17 is through a resistor 66 in parallel with a diode 62, through a pair of diodes 70 and 86 and a resistor 88, through a zener diode 92, through a body diode 58' of the MOSFET 58 (discussed below), and through a resistor 68 to the node 19. A similar path exists for current in the opposite direction from the node 19. The resistance 88 is very large, approximately 500K ohms in one embodiment; consequently, almost no current flows through this path and through the load 16. Since the resistances 66 and 68 are very small (approximately 33 ohms) compared to the resistance 88, the gate and cathode terminals of the SCRs are biased to maintain the SCRs 12 and 14 off. This leakage current path does, however, charge a capacitor 78 (the voltage of which is controlled by a zener diode 92 to be approximately fifteen volts in one embodiment) so that the charge may be used to accomplish a quick turn on of the pre-driver circuit when an input signal is applied by the source 30 and the voltage of the source 18 is at the proper level.

In order to assure that an input signal applied from the source 30 is not capable of switching the output SCRs 12 and 14 on while the voltage supplied by the source 18 is greater than the zero voltage window level (e.g., nine volts about the zero axis), the circuit 40 includes zero voltage turn-on circuitry incorporated as a function of the input driving circuit including the MOSFETs 57 and 58. This zero voltage turn-on circuitry limits the circuit 40 from turning on except in the zero voltage window. However, zero voltage turn-on requires that the circuit driving the SCRs 12 and 14 possesses an extremely fast turn-on time. Typically, a window of nine or ten volts is provided to allow turn on by the SCRs. In order for a driving circuit to turn on in a range of nine volts from the zero crossing point in a circuit with a power source furnishing 250 volts RMS. at 400 hertz, a turn-on time of less than ten microseconds is required. The present invention includes circuitry which provides both a turn-on window and an extremely rapid turn-on.

In order to provide the turn-on window, a pair of diodes 70 and 72 are individually connected to the drain terminals of the MOSFETs 57 and 58 and thus to the gate terminals of the SCRs 12 and 14. Each of the MOSFETs 57 and 58 also incorporates a body diode (57' or 58') at the junction between an N doped source terminal and a P doped substrate material. The diodes 70 and 72 and the body diodes 57' and 58' of the MOSFETs 57 and 58 form a full wave bridge circuit which has a positive terminal at a node 56 and a negative terminal at a node 59. Node 59 is common to the source terminals of the MOSFETs 57 and 58, the cathode of the photo detector array 44, and the emitter terminal of the NPN transistor 46. The anode of the photo detector array 44 is connected to the gate terminals of the MOSFETs 57 and 58 through the diode 60. Thus, the voltage appearing across the array 44 is, unless shunted, applied between the gate and source terminals of the MOSFETs 57 and 58. An NPN transistor 76 along with the diode 60 and the shunt resistor 50 provides the charging and discharging path for the gates of the MOSFETs 57 and 58 during the turn-on and turn-off cycles.

The storage capacitor 78 is also connected between the nodes 56 and 59 through a diode 86 and a resistor 88. The collector of the NPN transistor 48 is connected to the capacitor 78. The emitter of transistor 48 is connected to the anode of the photo detector array 44, and the base of transistor 48 is connected to the anode of the photo diode 42. The voltage limiting zener diode 92 is connected in parallel with the storage capacitor 78. The base of transistor 48 is shunted to the node 59 by a path through the collector-emitter terminals of the NPN transistor 46. The base of the transistor 46 is connected to the positive node 56 of the full wave bridge through a current limiting resistor 54 (e.g., 300K ohms) and a zener diode 52. The breakdown voltage of the zener diode 52 (e.g., seven volts) is adjusted to be less than the predetermined zero voltage window value for the relay circuit by the amounts of the forward voltage drops through the base-emitter of the transistor 46 across the diodes 70 and 57' (or 72 and 58'). Consequently, the zener diode 52 with aforementioned drops, establishes the value of the zero voltage window.

When no input signal is provided by the input signal source 30, both the photo diode 42 and the photo detector array 44 are inactive; and the gates of the MOSFETs 57 and 58 are shunted to their common source terminal by the PNP transistor 76 through its base resistor 50. This causes the MOSFETs 57 and 58 to remain off and keeps the SCRs 12 and 14 from turning on. As pointed out above, if the node 17 is positive with respect to the node 19, the only path for current flowing from node 17 to node 19 is through the resistor 66, the diodes 70 and 86, the resistor 88, the zener diode 92, the body diode 58' of the MOSFET 58, and the resistor 68. While the potential at node 17 remains positive, the potential of node 56 with respect to node 59 is the absolute value of the output voltage less two diode drops since the diodes 70 and 72 and the body diodes of the MOSFETs 57 and 58 form a full wave bridge. The conduction state of the transistor 46 depends on whether the voltage applied across the output terminals 16 and 18 exceeds the limits of the pre-determined zero voltage window. If the voltage across the output terminals 16 and 18 exceeds the zero voltage window, then zener diode 52 conducts and provides base current to the transistor 46. This shunts the photo diode 42 and the photo detector array 44 assuring that a positive gate voltage is not furnished by the array 44 to the MOSFETs 57 and 58. Thus, whenever the output voltage is greater than the zero voltage window and the SCRs are initially off, the input signals provided by the source 30 to the array 44 cannot reach the gate terminals of the MOSFETs 57 and 58. During any period in which the voltage across the output terminals 16 and 18 is greater than the zero voltage window and the SCRs are initially off, the input array 44 and the diode 42 are effectively shunted so that turn-on voltages are not applied to the MOSFETs 57 and 58. Consequently, the MOSFETs 57 and 58 remain off. As long as the output voltage exceeds the zero voltage window, even though the input signal is being furnished, the MOSFETs 57 and 58 will remain in the off state. Thus, the SCRs 12 and 14 will remain in the off state.

However, if the voltage across the output terminals 16 and 18 is within the pre-determined zero voltage window, the zener diode 52 does not conduct and no base current is available to the transistor 46. Consequently, the transistor 46 remains off and presents a very high impedance across the photo diode 42 and the photo detector array 44. Thus, an input signal furnished by the source 30 to the array 44 is allowed to reach the gate terminals of the MOSFETs 57 and 58.

When such an input signal is furnished by the source 30, the light emitting diodes 25 and 27 emit photo energy toward the photo diode 42 and the photo detector array 44. The photo diode 42 and cells of the photo detector array 44 have values such that the photo detector array 44 provides gate drive for MOSFETs 57 and 58 while the photo diode 42 enables the NPN transistor 48 which acts as the MOSFET fast turn on circuit. The diode 42 provides sufficient base current to drive the pull-up transistor 48 into conduction in the saturated condition so that the charge stored by the capacitor 78 may be applied through the collector-emitter path of the transistor 48, through the diode 60, and to the gate terminals of the MOSFETs 57 and 58.

If the voltage between the nodes 17 and 19 is less than the zero voltage window, the transistor 46 does not shunt the current provided by the diode 42 and the array 44. Consequently, the charge from the capacitor 78 is transferred to the gate terminals of the MOSFETs 57 and 58 This switches the MOSFETs 57 and 58 on instantaneously. The voltage provided across the array 44 and thus between the source and gate terminals of the MOSFETs 57 and 58 thereafter keeps those devices operating while the source 30 continues to supply an input signal.

In this zero voltage window region with the node 17 higher than the node 19, a gate terminal trigger current path is provided from the source 18 through the diode 62 and the MOSFETs 57 and 58 to the gate terminal of the SCR 14. The current through this path causes the SCR 14 to be triggered and latch in the on condition for the remainder of the half cycle. The SCR 14 will turn off when the load current decreases to a value below the minimum latching current of the SCR 14. However, the current path through the diode 64 and the MOSFETs 57 and 58 to the gate terminal of the SCR 12 causes the SCR 12 to function in a similar manner when the polarity of the output voltage reverses since all corresponding parts of the circuit are symmetrical.

When the MOSFETs 57 and 58 have been switched on and the SCR 12 or the SCR 14 has begun to conduct, the voltage between the nodes 17 and 19 is reduced to at most the value of the drop across one of the SCRs (typically about one volt). Consequently, essentially the entire voltage furnished by the source is furnished to the load 16. Since the voltage across the terminals 17 and 19 does not exceed approximately one volt, the zener diode 52 cannot conduct and provide base current to the shunt transistor 46. Consequently, the transistor 46 does not short out the array 44 and the photo diode 42; and gate voltage continues to be furnished to the MOSFETs 57 and 58 maintaining them in the on condition. Moreover, once the SCRs 12 and 14 have been turned on, the storage capacitor 78 is no longer charged by current from the node 17 since the voltage between the nodes 17 and 19 is only one diode drop while either of the SCRs 12 and 14 is conducting so no path exists to charge the capacitor 78. The MOSFETs 57 and 58, once turned on remain in the on condition until turned off by the removal of the input signal from the source 30.

Thus, by using MOSFETs 57 and 58 instead of the conventional SCRs in the pre-driver circuit, the configuration offers a low impedance and a linear voltage-current characteristic which is of especially importance within the zero crossing window. The low impedance of the MOSFETs causes less voltage drop across the pre-driver devices and results in earlier triggering when the line voltage changes polarity since there is no turn-on delay associated with the pre-driver circuit. In addition to the low impedance, another advantage is the resistor like behavior of the MOSFETs. Unlike SCRs which take a finite amount of time to turn-on in each half cycle and when the line voltage changes polarity, the MOSFET pre-driver circuit remains on once it is enabled and does not introduce distortion nor commutating voltage spikes that significantly contribute to EMI emissions. The MOSFETs respond as do pure resistors and are ready to conduct instantaneously.

When the input signal is removed by the source 30, the photo diode 42 and the array 44 cease producing current which in turn removes drive to the pull-up transistor 48. The charge that remains on the gates of the MOSFETs 57 and 58 bleeds off to their source terminals through the transistor 76 which becomes forward biased with the removal of the input signal. By turning off the MOSFETs 57 and 58, the SCR gate current is removed; and the operating one of the SCRs 12 and 14 remains in conduction until the load current decreases below the minimum latch-up current for the SCRs.

To prevent the output SCRs 12 and 14 from being falsely triggered when a rapid rate of voltage rise occurs across the output terminals 17 and 19, a suppression circuit comprising a pair of transistors 82 and 83, base-to-emitter resistors 84 and 85, and a capacitor 87 is added. Each transistor 82 and 83 shunts the gate of one of the SCRs. The values of capacitors 87 and the resistors 84 and 85 are such that the circuit is transparent in the normal operating condition and is only activated upon sensing a high rate of output voltage rise. In one circuit, these values are 1000 ohms and 100 picofarads when the source 18 is at 400 hertz. When a rate of voltage rise of 100 volts/microsecond occurs between the nodes 17 and 19, the capacitor 87 transfers approximately 10 milliamperes of current. This will cause the transistor 83 (for example) to conduct and clamp the gate to the cathode of the SCR 14 and prevent its latching on accidentally during a rapid voltage rise.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. A solid state relay comprising:
    a pair of silicon controlled rectifiers (SCRs) connected in inverse parallel relationship across a pair of output terminals adapted to be connected in series with a source of AC power and a load,
        each SCR having an anode connected to one of the pair of output terminals, a cathode connected to another of the pair of output terminals, and a gate terminal;

bidirectional semiconductor switching means for providing a single current path connecting the gate terminals of each of the pair of SCRs;

means for transferring current in one direction from each of the output terminals to each of the gate terminals;

a source of input signals;

means for applying signals from the source of input signals to rapidly enable the bidirectional semiconductor switching means to provide a current path to the gate terminals of the SCRs and to maintain the bidirectional semiconductor switching means in the on condition as long as an input signal is furnished by the source of input signals; and means for monitoring the voltage across the output terminals and allowing the operation of the means for applying signals from the source of input signals to rapidly enable the bidirectional semiconductor switching means only during a period in which the voltage across the output terminals is less than a preselected value.

2. A solid state relay as claimed in claim 1 in which the bidirectional semiconductor switching means for providing a single current path connecting the gate terminals of each of the pair of SCRs comprises:

a pair of metal-oxide-silicon field effect transistors each having source, drain, and gate terminals,
the source terminals being joined together,
the drain terminals being joined to the gate terminals of the SCRs, and
the gate terminals being joined to receive input signals furnished in response to signals from the source of input signals.

3. A solid state relay as claimed in claim 1 in which the means for monitoring the voltage across the output terminals and allowing the operation of the means for applying signals from the source of input signals to rapidly enable the bidirectional semiconductor switching means only during a period in which the voltage across the output terminals is less than a preselected value comprises:

a full wave rectifier bridge connected across the output terminals, and
means connected to respond to the voltage across the full wave rectifier bridge for shunting signals provided by the source of input signals when the voltage across the bridge is greater than the preselected value, the last mentioned means being disabled when the bidirectional semiconductor switching means is in the on condition.

4. A solid state relay as claimed in claim 3 in which the means connected to respond to the voltage across the full wave rectifier bridge for shunting signals provided by the source of input signals when the voltage across the bridge is greater than the preselected value comprises: a transistor connected to provide a shunt path for input signals, and means for enabling the transistor when the voltage across the bridge is greater than the preselected value.

5. A solid state relay as claimed in claim 1 in which the source of input signals comprises:

a source of digital signals, and
an optical coupler for transferring the signals to the means for applying signals from the source of input signals to rapidly enable the bidirectional semiconductor switching means to provide a current path to the gate terminals of the SCRs and to maintain the bidirectional semiconductor switching means in the on condition as long as an input signal is furnished by the source of input signals.

6. A solid state relay as claimed in claim 1 in which the means for applying signals from the source of input signals to rapidly enable the bidirectional semiconductor switching means to provide a current path to the gate terminals of the SCRs and to maintain the bidirectional semiconductor switching means in the on condition as long as an input signal is furnished by the source of input signals comprises:

a capacitor for storing charge provided across the output terminals,
circuit means for applying the charge stored on the capacitor to enable the bidirectional semiconductor switching means in response to signals from the source of input signals, and
circuit means for applying a signal furnished by the source of input signals to the bidirectional semiconductor switching means in the on condition as long as the input signal is continued.

7. A solid state relay comprising:

a pair of silicon controlled rectifiers (SCRs) connected in inverse parallel relationship across a pair of output terminals adapted to be connected in series with a source of AC power and a load,
each SCR having an anode, a cathode, and a gate terminal;
a bidirectional semiconductor switch providing a single current path connecting the gate terminals of each of the pair of SCRs to each other;
a unidirectional circuit element connecting each of the output terminals to one of the gate terminals;
a source of input signals;
a first circuit for applying signals from the source of input signals to rapidly enable the bidirectional semiconductor switch;
a second circuit for applying signals from the source of input signals to maintain the bidirectional semiconductor switch in the on condition as long as an input signal is furnished by the source of input signals; and
a bridge circuit for monitoring the voltage across the output terminals and allowing the operation of the first circuit for applying signals from the source of input signals to rapidly enable the bidirectional semiconductor switch only during a period in which the voltage across the output terminals is less than a preselected value.

8. A solid state relay as claimed in claim 7 in which the a bidirectional semiconductor switch providing a single current path connecting the gate terminals of each of the pair of SCRs to each other comprises:

a pair of metal-oxide-silicon field effect transistors each having source, drain, and gate terminals,
the source terminals being joined together,
the drain terminals being joined to the gate terminals of the SCRs, and
the gate terminals being joined to receive input signals furnished in response to signals from the source of input signals.

9. A solid state relay as claimed in claim 7 in which the bridge circuit for monitoring the voltage across the output terminals and allowing the operation of the first circuit for applying signals from the source of input signals to rapidly enable the bidirectional semiconductor switch only during a period in which the voltage across the output terminals is less than a preselected value comprises:
- a full wave rectifier bridge connected across the output terminals, and
- a circuit operating in response to the voltage across the full wave rectifier bridge for shunting signals provided by the source of input signals when the voltage across the bridge is greater than the preselected value, the last mentioned circuit being disabled when the bidirectional semiconductor switch is in the on condition.

10. A solid state relay as claimed in claim 9 in which the circuit connected to respond to the voltage across the full wave rectifier bridge for shunting signals provided by the source of input signals when the voltage across the bridge is greater than the preselected value comprises:
- a transistor connected to provide a shunt path for input signals, and
- a zener diode for enabling the transistor when the voltage across the bridge is greater than the preselected value.

11. A solid state relay as claimed in claim 7 in which the source of input signals comprises:
- a source of digital signals, and
- an optical coupler for transferring the signals to the first circuit for applying signals from the source of input signals to rapidly enable the bidirectional semiconductor switch and to the second circuit for applying signals from the source of input signals to maintain the bidirectional semiconductor switch in the on condition as long as an input signal is furnished by the source of input signals.

12. A solid state relay as claimed in claim 11 in which the first circuit for applying signals from the source of input signals to rapidly enable the bidirectional semiconductor switch comprises:
- a capacitor for storing charge provided across the output terminals,
- a transistor connected to respond to an output of the optical coupler to apply the charge stored on the capacitor to enable the bidirectional semiconductor switch in response to signals from the source of input signals; and
  - in which the second circuit for applying signals from the source of input signals to maintain the bidirectional semiconductor switch in the on condition as long as an input signal is furnished by the source of input signals comprises:
    - a circuit connecting an output of the optical coupler to the bidirectional semiconductor switch in the on condition as long as the input signal is continued.

13. A solid state relay comprising:
- a pair of silicon controlled rectifiers (SCRs) connected in inverse parallel relationship across a pair of output terminals adapted to be connected in series with a source of AC power and a load, each SCR having an anode, a cathode, and a gate terminal;
- a source of input signals;
- a bidirectional semiconductor switch including a pair of metal-oxide-silicon field effect transistors each having source, drain, and gate terminals, the source terminals being joined together, the drain terminals being joined to the gate terminals of the SCRs, and the gate terminals being joined to receive input signals furnished in response to signals from the source of input signals;
- a unidirectional circuit element connecting each of the output terminals to one of the gate terminals of the SCRs;
- a first circuit for applying signals from the source of input signals to rapidly enable the bidirectional semiconductor switch;
- a second circuit for applying signals from the source of input signals to maintain the bidirectional semiconductor switch in the on condition as long as an input signal is furnished by the source of input signals; and
- a bridge circuit for monitoring the voltage across the output terminals and allowing the operation of the first circuit for applying signals from the source of input signals to rapidly enable the bidirectional semiconductor switch only during a period in which the voltage across the output terminals is less than a preselected value.

14. A solid state relay as claimed in claim 13 in which the bridge circuit for monitoring the voltage across the output terminals and allowing the operation of the first circuit for applying signals from the source of input signals to rapidly enable the bidirectional semiconductor switch only during a period in which the voltage across the output terminals is less than a preselected value comprises:
- a full wave rectifier bridge connected across the output terminals, and
- a circuit connected to respond to the voltage across the full wave rectifier bridge for shunting signals provided by the source of input signals when the voltage across the bridge is greater than the preselected value, the last mentioned circuit being disabled when the bidirectional semiconductor switch is in the on condition.

15. A solid state relay as claimed in claim 14 in which the circuit connected to respond to the voltage across the full wave rectifier bridge for shunting signals provided by the source of input signals when the voltage across the bridge is greater than the preselected value comprises:
- a transistor connected to provide a shunt path for input signals, and
- a zener diode for enabling the transistor when the voltage across the bridge is greater than the preselected value.

16. A solid state relay as claimed in claim 15 in which the source of input signals comprises:
- a source of digital signals, and
- an optical coupler for transferring the signals to the first circuit for applying signals from the source of input signals to rapidly enable the bidirectional semiconductor switch and to the second circuit for applying signals from the source of input signals to maintain the bidirectional semiconductor switch in the on condition as long as an input signal is furnished by the source of input signals.

17. A solid state relay as claimed in claim 16 in which the first circuit for applying signals from the source of input signals to rapidly enable the bidirectional semiconductor switch comprises:
- a capacitor for storing charge provided across the output terminals,
- a transistor connected to respond to an output of the optical coupler to apply the charge stored on the capacitor to enable the bidirectional semiconductor switch in response to signals from the source of input signals; and in which the second circuit for applying signals from the source of input signals to maintain the bidirectional semiconductor switch in the on condition as long as an input signal is furnished by the source of input signals comprises:

a circuit connecting an output of the optical coupler to the bidirectional semiconductor switch in the on condition as long as the input signal is continued.

* * * * *